(12) United States Patent
Betts et al.

(10) Patent No.: US 7,739,063 B2
(45) Date of Patent: Jun. 15, 2010

(54) NONLINEAR MEASUREMENT SYSTEM ERROR CORRECTION

(75) Inventors: Loren C. Betts, Rohnert Park, CA (US); Daniel B. Gunyan, Rohnert Park, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/940,296

(22) Filed: Nov. 14, 2007

(65) Prior Publication Data

US 2009/0125264 A1 May 14, 2009

(51) Int. Cl.
*G01R 13/00* (2006.01)
(52) U.S. Cl. ......................................... 702/72
(58) Field of Classification Search ............ 702/72, 702/104, 109
See application file for complete search history.

(56) References Cited

U.S. PATENT DOCUMENTS

| 6,920,407 | B2 * | 7/2005 | Adamian et al. | 702/104 |
| 2003/0102907 | A1 * | 6/2003 | Tasker et al. | 330/2 |

OTHER PUBLICATIONS

K. Kurokawa, "Power Waves and the Scattering Matrix", IEEE Transactions on Microwave Theory and Techniques,, vol. 13, pp. 194-202, 1965.

U. Lott,"Measurement of magnitude and phase of harmonics generated in nonlinear microwave two-ports" IEEE Transactions on Microwave Theory and Techniques, vol. 37, pp. 1506-1511, 1989.

T. Van den Broeck and J. Verspecht, "Calibrated vectorial nonlinear-network analyzers", IEEE MTT-S International Microwave Symposium Digest, pp. 1069-1072, May 1994.

P.S. Blockley, D, Gunyan, J.B. Scott, "Mixer-based, vector-corrected, vector signal/network analyzer offering 300kHz-20GHz bandwidth and traceable phase response", IEEE MTT-S International Microwave Symposium Digest, pp. 4,, Jun. 2005.

W. Kruppa, K. F. Sodomsky, "An Explicit Solution for the Scattering Parameters of a Linear Two-Port Measured with an Imperfect Test Set (Correspondence)," IEEE Transactions on Microwave Theory and Techniques, vol. 19, No. 1, pp. 122-123, Jan. 1971.

S. Rehnmark, "On the Calibration Process of Automatic Network Analyzer Systems (Short Papers)," IEEE Transactions on Microwave Theory and Techniques, vol. 22, No. 4, pp. 457-458, Apr. 1974.

R. B. Marks, "Formulations of the basic vector network analyzer error model including switch terms," in 50th ARFTG Conf. Dig., Dec. 1997, pp. 115-126.

* cited by examiner

*Primary Examiner*—Drew A Dunn
*Assistant Examiner*—Stephen J Cherry
(74) *Attorney, Agent, or Firm*—Marc Bobys

(57) ABSTRACT

A method for eliminating the systematic measurement errors from a measurement system, for example a vector network analyzer, such that an accurate representation of the behavior of a nonlinear device can be measured or characterized. The cross-frequency phase and absolute amplitude of the measured voltage waves applied to and emanating from the nonlinear device are measured and error corrected. These waves may be used for nonlinear device characterization or modeling.

23 Claims, 6 Drawing Sheets

NONLINEAR MEASUREMENT SYSTEM ERROR CORRECTION

BACKGROUND OF THE INVENTION

Accurate nonlinear measurements on a device under test performed by a measurement system, for example a Vector Network Analyzer (VNA), require relative and absolute error correction to be performed on the measurement equipment itself.

FIG. 1 is a schematic diagram of a traditional four-wave reflectometer 101 commonly used in measurement systems, for example a VNA. The VNA uses an RF source 109 and a source transfer switch 105 to characterize a two port electrical system, referred to as a device under test (DUT) 103. A local oscillator (LO) 107 is identified in the four-wave reflectometer 101. The VNA is able to measure voltage waves of the four-wave reflectometer in the forward and reverse stimulation directions simultaneously. The reflectometers separate the incident and reflected voltage waves of the DUT 103. These voltage waves are then corrected so that the actual performance (using Scattering Parameters or absolute voltage waves) of the DUT 103 can be accurately measured.

In FIG. 1, the variables used are described as:

$a_x^y$=the incident voltage wave (independent variable); and $b_x^y$=the reflected voltage wave (dependent variable), where x is the port number and y is the error term designation.

Scattering Parameters ("S-parameters") are properties used in electrical systems to describe the electrical behavior of linear electrical networks when undergoing various steady state stimuli by small signals. The reflectometer 101 can be characterized using S-parameters described in Equations 1.

$$b_1^1 = a_1^1 S_{11} + a_2^1 S_{12}$$
$$b_2^1 = a_2^1 S_{22} + a_1^1 S_{21}$$
$$\begin{bmatrix} b_1^1 \\ b_2^1 \end{bmatrix} = \begin{bmatrix} S_{11} & S_{12} \\ S_{21} & S_{22} \end{bmatrix} \begin{bmatrix} a_1^1 \\ a_2^1 \end{bmatrix}$$

Equations 1

The DUT 103 S-parameters can be calculated from the corrected voltage waves. A corrected voltage wave is one where the measurement system's systematic errors have been removed by performing a calibration and error correction on un-corrected voltage waves, resulting in accurate voltage waves from the DUT. To apply the S-parameters to the DUT, all four of the corrected independent and dependent voltage waves are measured, and then applied to the generalized S-parameter matrix formulations in Equations 1.

Imperfections in the VNA hardware make it necessary to perform error correction to get an accurate representation of the actual voltage waves of the DUT.

A thorough way to characterize the electrical system is through error models. Error models account for systematic errors. Vector error correction is an accurate form of error correction as it accounts for major sources of systematic error.

Vector error correction is a process of characterizing systematic errors by measuring known calibration standards, and then removing the effects of these errors from subsequent measurements. Vector error correction is an example of relative error correction.

A majority of VNAs have a 12-term error model for error correction built into the VNA. The 12-term error model is divided into two sections: a forward and reverse error model. Two-port calibration usually requires twelve measurements on four known hardware standards, short-open-load-through or SOLT. The two-port calibration quantifies twelve systematic error correction terms that are used for subsequent measurements.

An 8-term error model is another generalized error model to correct systematic errors. A benefit of using this model is the ability to supply a signal on both ports at the same time without affecting the error correction process. Any differences to the match seen at the source with respect to the match seen at the terminating load are measured and accounted for. This is performed with all four incident and reflected waves. This identifies the 8-term error model as a single mathematical model that can account for measurements when either port 1, port 2, or both port 1 and 2 are supplying a signal when making both forward and reverse measurements. Error adapters or error correction terms on each side (port 1 and port 2) of the measurement system relate the measured waves to the corrected waves and have no implied relationship to the direction of device stimulation or changes in source or load match of the VNA.

A third error correction model, the 16-term error model, can also be used to correct the systematic errors in a measurement system. However, the 16-term error model is an elaborate process and is difficult to implement practically.

As mentioned above, VNAs utilize vector error correction to correct the systematic measurement errors. In vector error correction, the input frequency to the DUT 103 is the same as the output frequency of the DUT 103. The error correction (typically 12-term) is applied to ratios of measurements (S11, S21, etc).

The 12 and 8-term error models are implicitly known as linear models.

Present error correction is insufficient to meet the needs of characterizing complex electrical systems that exhibit nonlinear behavior. One challenging aspect of measurements with the VNA is to get error corrected nonlinear measurements for the DUT 103.

Error correction for nonlinear measurements can be described as two types: relative and absolute. With relative error correction, linear systematic measurement errors are adjusted for by the vector error correction or by using hardware standards common in the art.

Absolute error correction relies on the absolute amplitude of each measured frequency component. In addition to this, the cross-frequency phase of each frequency component is related to a common time base. The cross-frequency phase is the relative phase difference between each frequency in the measured spectrum. Relating the phase in this way provides a phase difference between all the measured frequency components.

Contemporary VNAs do not accurately measure the nonlinear behavior of the DUT 103 wherein the absolute amplitude and cross-frequency phase of the measured spectral content is required. As a result, a time domain signal representation cannot be constructed accurately from the frequency domain measurements of the waveforms emanating from a nonlinear DUT 103. Additionally, this lack of accuracy inhibits the generation of precise nonlinear behavior models, primarily for use in simulation and design.

Accordingly, a need exists to determine and characterize an electrical system accurately.

DETAILED DESCRIPTION

The methods described herewith provide an accurate representation of linear and nonlinear behavior of a DUT. This is achieved by performing relative error correction and absolute error correction. The results of the relative and absolute error correction are adapted into an error correction model. The error correction model is then used to correct raw measured voltage waves from the DUT. An accurate representation of the behavior of the DUT is constructed across all measured frequencies.

The methods correct the systematic errors by measuring the absolute amplitude and the cross-frequency phase of each unratioed frequency accurately.

The methods provide a way (i) to convert nonlinear frequency domain device measurements to accurate time domain nonlinear device performance, for example in vector calibrated oscilloscopes; (ii) to accurately determine group delay measurements on frequency converters, mixers and doublers; (iii) to extract and validate linear and nonlinear data device models (physical, behavioral, simulation and analysis); and (iv) to calibrate a measurement system where an accurate representation of the input and output waves with reference to the DUT is required.

The methods can be applied to a measurement system that is capable of measuring complex-valued (absolute amplitude and cross-frequency phase) forward and reverse traveling waves. Examples of measurement systems include oscilloscopes (real time and equivalent time), vector network analyzers, and vector signal analyzers.

Figure 2A:
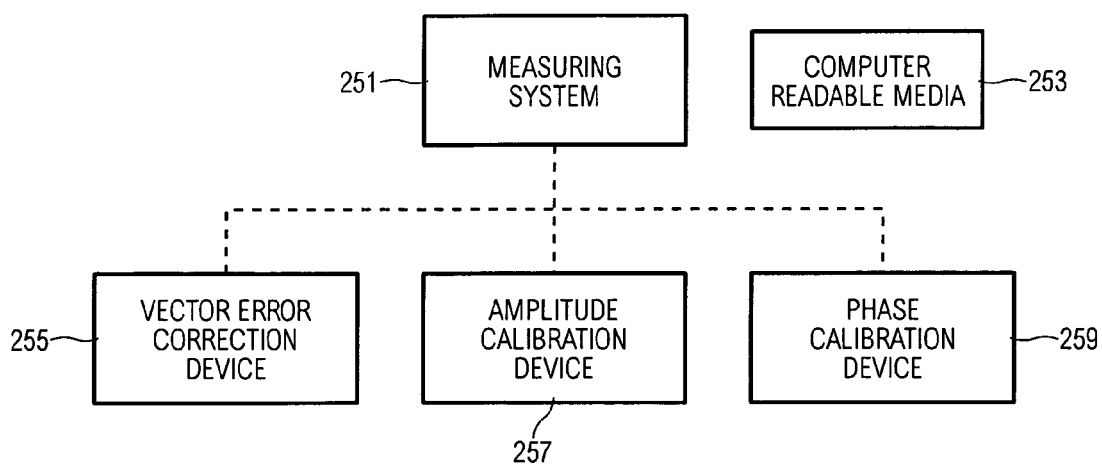
FIGS. 2A-B describe a calibration setup for a measurement system employing the inventive calibration method.
Figure 2B:
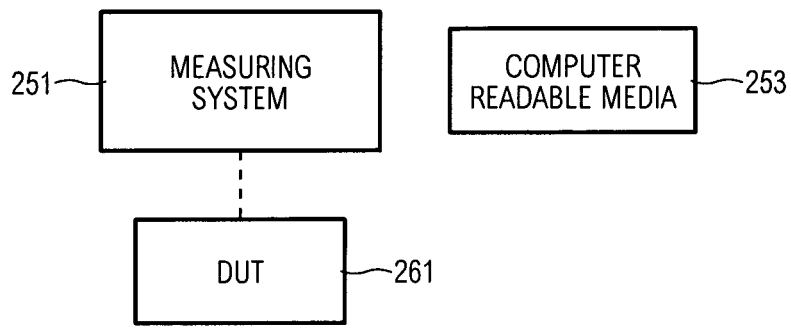

FIGS. 2A-B describe a calibration setup for a measurement system 251 employing the inventive methods.

FIG. 2A illustrates a vector error correction device 255, an amplitude calibration device 257, and a phase calibration device 259. The devices 255, 257 and 259 are employed in a nonlinear calibration process of the measurement system 251 to obtain the relative and absolute error correction terms for the measurement system 251. An example of a vector error correction device is an electronic or mechanical calibration standard. An example of the amplitude calibration device 257 is a power sensor. An example of the phase calibration device 259 is a comb or pulse generator.

The vector error correction device 255 is attached to the measurement system 251 to adjust for linear systematic measurement errors (or relative error correction). Next, the amplitude calibration device 257 is attached and measurements are performed. Finally, the phase calibration device 259 is attached and measurements performed. The amplitude calibration device 257 adjusts for the absolute amplitude of each measured frequency component. The phase calibration device 259 adjusts for the cross-frequency phase. Both calibration devices 257 and 259 relate the frequency component to a common time base ("absolute error correction"). The measured data is then used to calculate the system calibration parameters ("error terms").

FIG. 2B describes a DUT 261 connected directly to the system 251 and measured. System measurements are performed on the DUT 261. The error terms (derived in the setup described in FIG. 2A) are used to calculate the corrected voltage waves of the DUT 261. The error corrected results may then be displayed on the measurement system 251 interface to describe the behavior of the DUT 261.

FIGS. 2A-B also describe computer readable media 253 containing code for providing instructions to and for execution by the measurement system 251. The computer readable media 253 can be, for example, a ROM, a RAM, a DVD, a hard drive, or other computer readable media known in the art. The code residing on the computer readable media 253 can be used by a Central Processing Unit within the measurement system 251 to execute the instructions. Alternatively, the code can be executed by a computer external to the measurement system 251.

Figure 3A:
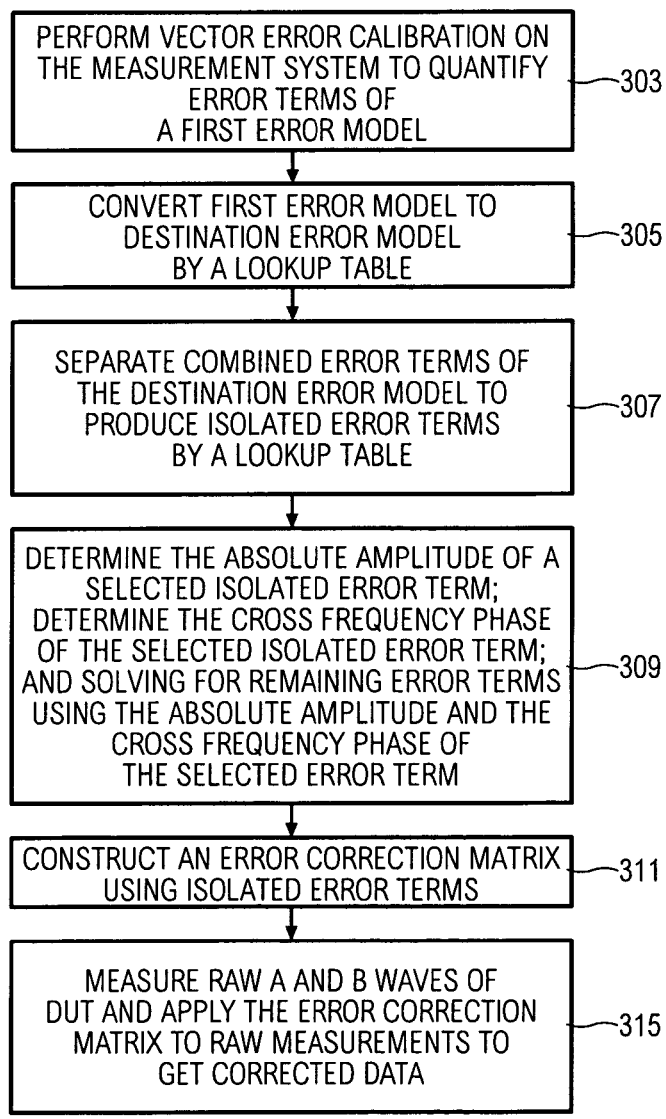
FIGS. 3A-C are flow charts describing nonlinear error correction using the inventive method.
Figure 3B:
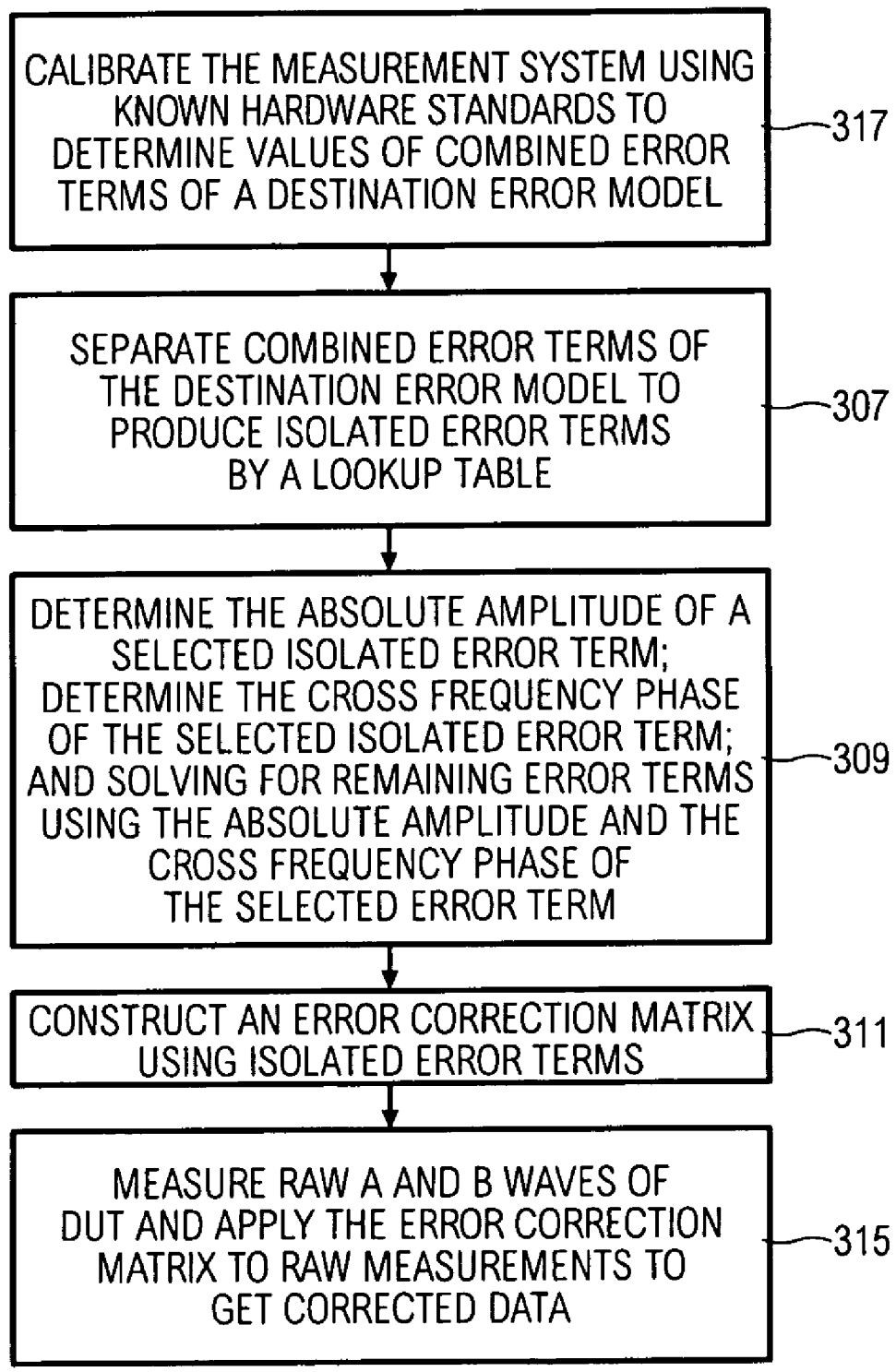
Figure 3C:
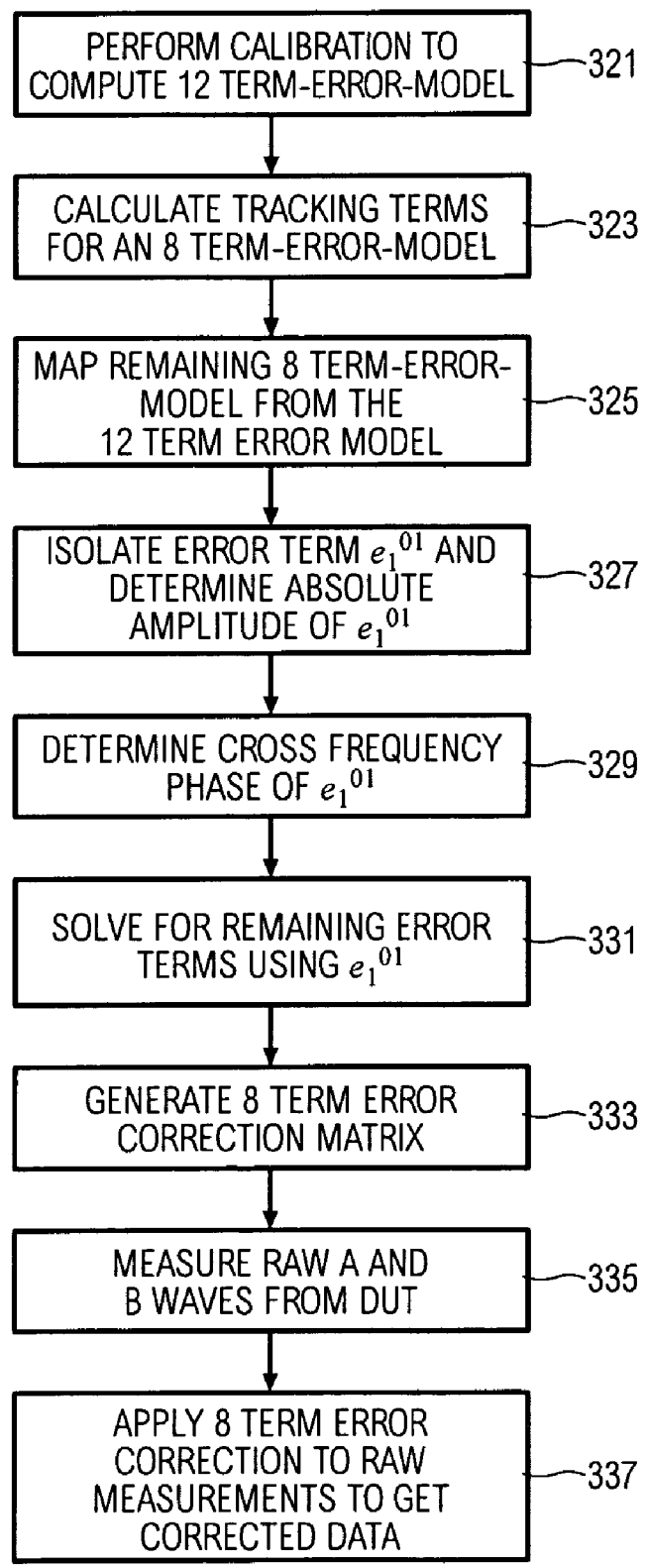

FIGS. 3A-C are flow charts illustrating methods of nonlinear error correction using the hardware described in FIGS. 2A-B.

FIG. 3A is a flow chart describing a nonlinear error correction method using the measuring system 251 that has an existing error correction model. The existing error model can be an error model that is built into the measurement system 251 to perform relative error correction.

Block 303 describes performing relative error correction on the measurement system 251 to quantify error terms of the existing error correction model ("first error model"). Relative error correction is performed using the vector error correction device 255.

Block 305 describes converting the first error model to a destination error model. This conversion from the first error model to the destination error model can be performed using a lookup table where the conversion from the first error model and destination error model has been mathematically derived beforehand. The destination error model is an error model employed by the measurement system 251 to represent the nonlinear characterization of the measurement system 251 and eventually the DUT 261. The conversion performed in Block 305 can result in a combined representation of the error terms ("combined error terms").

Block 307 describes separating combined error terms of the destination error model into an isolated representation of error terms ("isolated error terms") of the destination error model. Separating the combined error terms into isolated error terms aids in determining the absolute amplitude and cross-frequency phase of all the destination error terms. The separation of the error terms can be performed using a lookup table where the error terms of the first error model and destination error model have been mathematically derived beforehand.

Block 309 describes performing absolute error correction on the measurement system 251. This is achieved by determining the absolute amplitude and the cross-frequency phase of the isolated error terms. This comprises selecting an error term from the isolated error terms and determining the absolute amplitude of the selected error term. The absolute amplitude of the selected error term is determined using an amplitude calibration device 257. Following this, the cross-frequency phase of the selected error term is determined using the phase calibration device 259.

The absolute amplitude and cross-frequency phase of the selected error term is used to solve for the remaining error terms of the destination error model.

Block 311 describes constructing an error correction matrix using the isolated error terms of the destination error correction model arrived at in Block 309.

Block 315 describes measuring raw incident and reflected voltage waves of the device under test 261. The device under test 261 is connected to the measurement system 251. The error correction matrix constructed in Block 311 is applied to the raw measurements to get corrected data representing the linear and nonlinear characteristics of the DUT 261. The error corrected results of DUT behavior may then be displayed on the measurement system 251 or stored on the computer readable media 253.

The first error correction model referred to in FIG. 3A can be a 12-term error model or an 8-term error model used extant in the measurement system 251. The method described in FIG. 3A can be used to describe converting from a 12-term error model to an 8-term error model. Similarly, it can be ascribed to convert from a 12-term error model to a 16-term error model as well. The method described in FIG. 3A can be used to calculate an error correction matrix for an 8-term error model, a 16-term error model, or another suitable error model.

FIG. 3B describes a flow chart illustrating a method of determining nonlinear characteristics of the measurement system 251 that does not use a first error correction model. In the measurement system 251, the error terms of the destination error model are set up to account for nonlinear characterization. Block 317 describes applying hardware standards to determine the error terms of the destination error model. This step is similar to Block 303 and corrects for linear errors of the measuring system. Examples of hardware standards are SOLT measurements and electrical standards such as an electronic calibration standard. Each electrical state is known accurately and the calibration process runs through these states to determine the error terms. The flow then proceeds to Blocks 307, 309, 311 and 315. These Blocks were described in FIG. 3A.

FIG. 3C illustrates a flow chart describing in detail the method illustrated FIG. 3A. The flow chart of FIG. 3C converts a standard 12-term error model to an 8-term error correction model. The flow chart describes the steps of determining relative and absolute error correction of the measuring system 251, creating an 8-term error correction matrix, and applying the matrix to the DUT 261.

In Block 321 of FIG. 3C, relative error correction is performed on the measurement system 251 to quantify error terms of a standard 12-term error correction model using the vector error correction device 255.

In Blocks 323 to 333, the terms of the standard 12-term error model are converted into an 8-term error model and subsequently into a correction matrix. Block 323 describes relating (combined) port tracking terms of the 8-term error model, for example, $e_1^{10}e_2^{01}$ and $e_2^{10}e_1^{10}$, to error terms of the standard 12-term error mode. (This is also referred to as "tracking conversion." Further details of the tracking conversion are described below in FIGS. 4, 5, 6 and 7.)

In Block 325, the remaining terms (for example, port match terms and port directivity terms) of the 8-term error model are calculated using mathematical equations (described later).

In Block 327, a port tracking term $e_1^{01}$, is isolated from its combined form $e_2^{10}e_1^{01}$ in Block 323. The absolute amplitude of $e_1^{01}$ is determined by using the amplitude calibration device 257 from FIG. 2A. In a similar manner, Block 329 describes isolating the cross-frequency phase of the port tracking term $e_1^{01}$ using the phase calibration device 259 from FIG. 2A.

Block 331 describes deriving the remaining port tracking terms $e_2^{01}$, $e_1^{10}$ and $e_2^{10}$ by using the error terms derived in Block 325.

After deriving all the error correction terms, Block 333 identifies generating an 8-term error correction matrix for nonlinear characterization of the DUT 261.

System measurements are performed on the DUT 261 to arrive at the raw incident and reflected a and b voltage waves in Block 335.

In Block 337, the 8-term error correction matrix generated in Block 333 is applied to raw measurements of incident and reflected voltage waves, a and b, to determine corrected measurements for the a and b voltage waves measurements.

Figure 4:
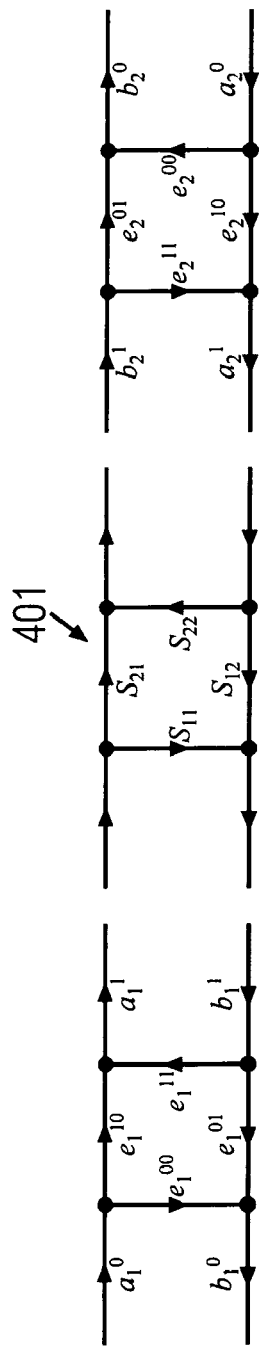
FIG. 4 is a diagram of an 8-term error model.

FIG. 4 describes an 8-term error correction model for a two-port measurement system 251. The error adapters are described on each side of the S-parameter terms 401. The error adapters relate the measured waves to the corrected waves and do not have an implied relationship to the direction of device stimulation or changes in source and load match of the measurement system 251.

In FIG. 4, the variable terms are defined as:

$a_1^0, a_2^0$ = independent voltage waves;

$b_1^0, b_2^0$ = dependent voltage waves;

$a_1^1, a_2^1$ = incident voltage wave of port 1 and port 2; and $b_1^1, b_2^1$ = are the reflected voltage wave of port 1 and port 2.  Equations 2

The error correction terms are defined as $e_{port\ index}^{term\ index}$ and described as:

$e_1^{11}$ and $e_2^{11}$ = port match terms;

$e_1^{01}, e_1^{10}, e_2^{01}$ and $e_2^{10}$ = port tracking terms; and $e_1^{00}$ and $e_2^{00}$ = port directivity terms.  Equations 3

Figure 1:
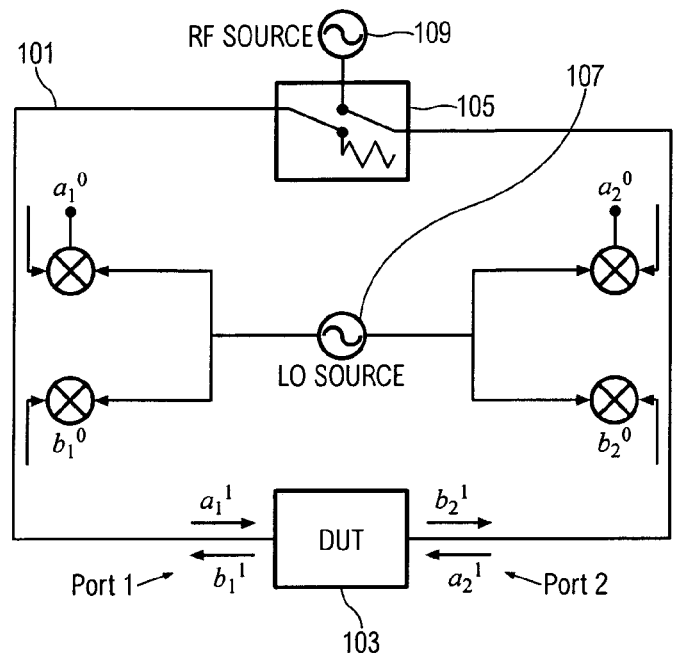
FIG. 1 is a schematic of a four reflectometer based measurement system and 2 port device under test.

The 8-term error model allows for the non-ideal effects of the reflectometer 101 and the port switches to be contained in the error correction terms. A non-constant port match will cause an unaccounted for change in the match in the terminating port. This will result in a reflected signal in the $a_1^0$ (reverse direction) and the $a_2^0$ (forward direction) voltage waves of FIG. 1. To account for the changing characteristics of the source and load match, all four-voltage waves are measured.

Figure 5A:
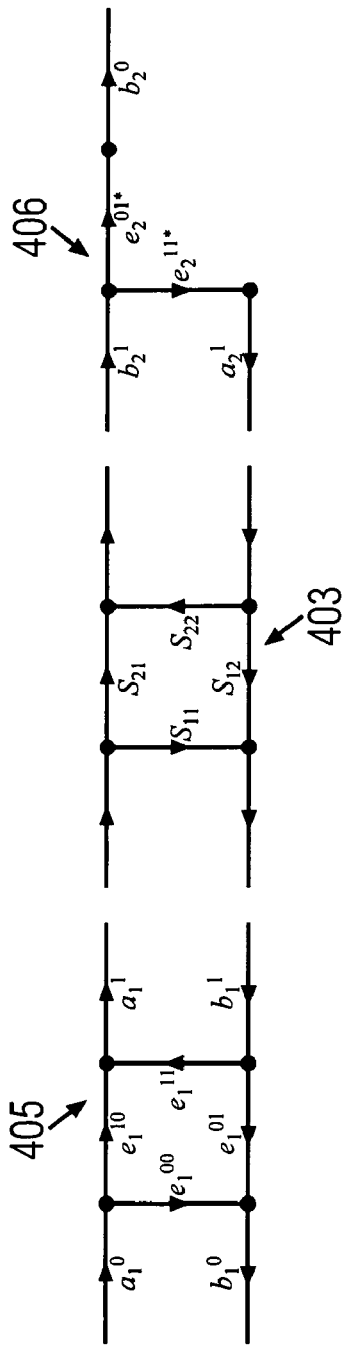
FIGS. 5A-B illustrate a 12-term error model for the forward and reverse direction.
Figure 5B:
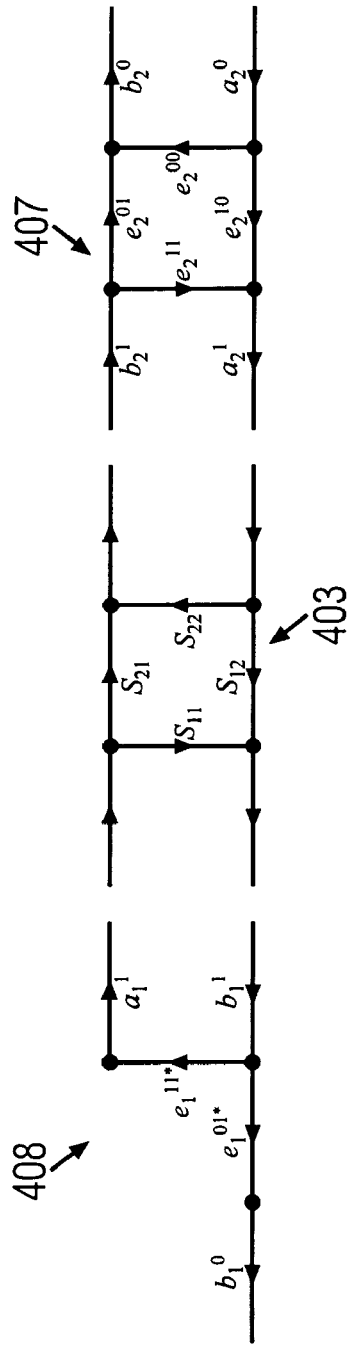

FIG. 5A and FIG. 5B describe a 12-term error model in forward and reverse directions respectively. In Equations 4 below, terminology commonly used in the art is associated with the error adapters 405, 406, 407 and 408 of the 12-term model in FIGS. 5A-B.

$e_1^{00}$ = Port 1 Directivity($dp_1$)

$e_1^{11}$ = Port 1 Source Match($smp_1$)

$e_2^{11}$* = Forward Load Match($lm_{fwd}$)

$e_1^{10}e_1^{01}$ = Forward Reflection Tracking($rt_{fwd}$)

$e_1^{10}e_2^{01}$* = Forward Transmission Tracking($tt_{fwd}$)

$e_2^{00}$ = Port 2 Directivity($dp_2$)

$e_2^{11}$ = Port 2 Source Match($smp_2$)

$e_1^{11}$* = Reverse Load Match($lm_{rev}$)

$e_2^{10}e_2^{01}$ = Reverse Reflection Tracking($rt_{rev}$)

$$e_2^{10} e_1^{01*} = \text{Reverse Transmission Tracking}(tt_{rev}) \quad \text{Equations 4}$$

The '*' identifies a term in the 12-term model that is different to the term in the 8-term model. For example $e_2^{11*}$ is the port match (specifically $lm_{fwd}$) of the 12-term model while $e_2^{11}$ is the port match of the 8-term model. The 12-term error model accounts for a change in load match by including a source match and a load match term. This is in contrast to the 8-term error model; the 8-term error model accounts for the match change by measuring all the incident and reflected (a and b) voltage waves and using a single port match term. Any changes in the source or load match of the port are sensed in the incident and reflected (a and b) voltage waves.

The 12-term error model is divided into two sections: the forward error model of FIG. 5A, and the reverse error model of FIG. 5B. The 12-term error model has the associated error adapters on each side of the measurement system 251 S-parameter terms 403. The error correction terms 405, 406, 407 and 408 on each side of the S-parameter terms 403 account for the hardware imperfections of port 1 and port 2 of the measurement system 251 and associated cables connected to the DUT 261. The two models account for a different match (source and load) of the measurement system 251 and corresponding hardware cables. This is dependent on whether the physical port is sourcing or receiving a signal as well as taking into account the imperfection of the source transfer switch 105 into consideration. As an example, consider a VNA using a single stimulus source and a port switch to change the direction from port 1 to port 2 and vise versa. First, the match of the port switch when the termination is switched into port 1 can be different when the termination is switched into port 2. Second, the match of the source when switched into port 1 can be different when the termination is switched into port 1. These differences are taken into account by separate models depending on the state of the port switch.

Figure 6A:
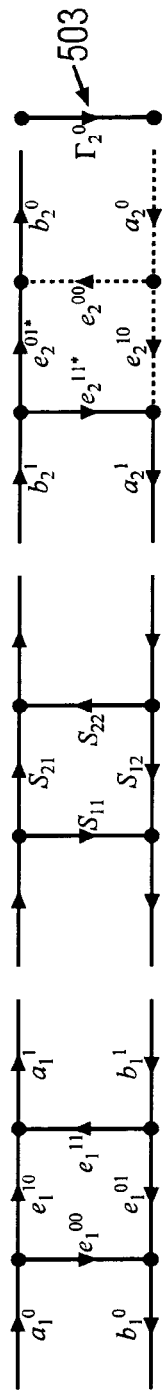
FIGS. 6A-B illustrate a modified 12-term error model for the forward and reverse direction.
Figure 6B:
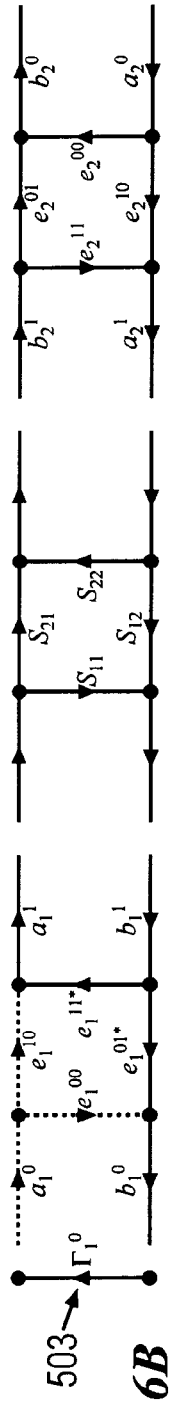

Converting the 12-term error model to the 8-term error model involves modifying the 12-term error model and then combining the forward and reverse sections of the 12-term error model. FIG. 6A illustrates a modified 12-term error model for the forward section. FIG. 6B illustrates a modified 12-term error model for the reverse section. Port match difference terms $\Gamma_1^0$, $\Gamma_2^0$ 503 are included in FIGS. 6A-B to relate the 12-term error model of FIGS. 5A-B to the 8-term error model of FIG. 4. The port match difference terms 503 aid in converting the 12-term error model to the 8-term error model. This is achieved by extracting out the port specific match terms from the error adapters in the forward and reverse directions. In this analysis, leakage terms are ignored.

The port match difference terms $\Gamma_1^0$, $\Gamma_2^0$ 503 correspond to the change in match of the terminating load (direction dependent). This can be thought of as the change in the port match error terms ($e_1^{11}$, $e_2^{11}$) when the source transfer switch 105 is changed to terminate the output of the DUT 261 instead of applying the source signal to the input of the DUT 261. A port specific load match term now exists for each direction.

Adding the port match difference terms 503 to the 12-term error model will require the inclusion of the additional error adapter terms ($e_1^{10}$, $e_1^{00}$, $e_2^{10}$ and $e_2^{00}$) to the models of FIGS. 6A-B. The relationship can be generated as shown in Equations 5.

$$e_1^{00} = dp_1 \quad \text{Equations 5}$$

$$e_1^{11} = e_1^{11*} - \frac{e_1^{10} e_1^{01} \Gamma_1^0}{1 - e_1^{00} \Gamma_1^0}$$

-continued $$= lm_{rev} - \frac{rt_{fwd} \Gamma_1^0}{1 - dp_1 \Gamma_1^0} = smp_1$$

$$e_1^{10} e_1^{01} = rt_{fwd}$$

$$e_1^{10} e_2^{01} = e_1^{10} e_2^{01*}[1 - e_2^{00} \Gamma_2^0] = tt_{fwd}[1 - dp_2 \Gamma_2^0]$$

$$\Gamma_1^0 = \frac{a_1^0}{b_1^0}$$

$$e_2^{00} = dp_2$$

$$e_2^{11} = e_2^{11*} - \frac{e_2^{10} e_2^{01} \Gamma_2^0}{1 - e_2^{00} \Gamma_2^0}$$

$$= lm_{fwd} - \frac{rt_{rev} \Gamma_2^0}{1 - dp_2 \Gamma_2^0} = smp_2$$

$$e_2^{10} e_2^{01} = rt_{rev}$$

$$e_2^{10} e_1^{01} = e_2^{10} e_1^{01*}[1 - e_1^{00} \Gamma_1^0] = tt_{rev}[1 - dp_1 \Gamma_1^0]$$

$$\Gamma_2^0 = \frac{a_2^0}{b_2^0}$$

The terms $e_1^{11}$ and $e_2^{11}$, shown in Equations 5, are the calculated port match error terms (for port 1 and port 2 respectively). These terms correspond to terms $smp_1$ and $smp_2$ in the 12-term error model of Equations 4.

In the four wave reflectometer 101, all the independent ($a_1^0$, $a_2^0$) and dependent ($b_1^0$, $b_2^0$) voltage waves can be measured directly. The 12-term error model in FIGS. 6A-B is then utilized during relative error correction. The port match difference terms $\Gamma_1^0$, $\Gamma_2^0$ 503 can then be calculated as the ratio of these measurements as shown in the Equations 5 above. Equations 5 also provides a method of calculating the match terms directly from the 12-term error coefficients. This is illustrated in Equations 6.

$$e_1^{11} = e_1^{11*} - \frac{e_1^{10} e_1^{01} \Gamma_1^0}{1 - e_1^{00} \Gamma_1^0} = lm_{rev} - \frac{rt_{fwd} \Gamma_1^0}{1 - dp_1 \Gamma_1^0} \quad \text{Equations 6}$$

$$e_1^{11} - lm_{rev} = -\frac{rt_{fwd} \Gamma_1^0}{1 - dp_1 \Gamma_1^0}$$

$$[e_1^{11} - lm_{rev}][1 - dp_1 \Gamma_1^0] = -rt_{fwd} \Gamma_1^0$$

$$\Gamma_1^0[-e_1^{11} dp_1 + lm_{rev} dp_1 + rt_{fwd}] = -e_1^{11} + lm_{rev}$$

$$\Gamma_1^0 = \frac{lm_{rev} - e_1^{11}}{rt_{fwd} + dp_1[lm_{rev} - e_1^{11}]} \text{ and since } e_1^{11} \text{ is } smp_1$$

$$\Gamma_1^0 = \frac{lm_{rev} - smp_1}{rt_{fwd} + dp_1[lm_{rev} - smp_1]}$$

$$\Gamma_2^0 = \frac{lm_{fwd} - smp_2}{rt_{rev} + dp_2[lm_{fwd} - smp_2]}$$

The port tracking terms of the 8-term error model in FIG. 4 can be determined using the solutions for port match difference terms $\Gamma_1^0$, $\Gamma_2^0$ 503 and tracking conversions for $e_1^{10} e_2^{01}$ and $e_2^{10} e_1^{01}$ in Equations 5. This is shown in Equations 7.

$$\Gamma_2^0 = \frac{lm_{fwd} - smp_2}{rt_{rev} + dp_2[lm_{fwd} - smp_2]} \quad \text{Equations 7}$$

$$e_1^{10} e_2^{01} = tt_{fwd}[1 - dp_2 \Gamma_2^0]$$

-continued $$e_1^{10}e_2^{01} = tt_{fwd}\left[1 - dp_2 \frac{\text{lm}_{fwd} - smp_2}{rt_{rev} + dp_2[\text{lm}_{fwd} - smp_2]}\right]$$

$$\Gamma_1^0 = \frac{\text{lm}_{rev} - smp_1}{rt_{fwd} + dp_1[\text{lm}_{rev} - smp_1]}$$

$$e_2^{10}e_1^{01} = tt_{rev}[1 - dp_1\Gamma_1^0]$$

$$e_2^{10}e_1^{01} = tt_{rev}\left[1 - dp_1 \frac{\text{lm}_{rev} - smp_1}{rt_{fwd} + dp_1[\text{lm}_{rev} - smp_1]}\right]$$

The port match difference terms $\Gamma_1^0$, $\Gamma_2^0$ 503 are only required if the measurement hardware does not allow for the measurement of all four waves ($a_1^0$, $a_2^0$, $b_1^0$, $b_2^0$) simultaneously, for example when using a three reflectometer VNA wherein the reference reflectometer is between the source and the source transfer switch 105.

The reflectometer of the measurement system 251 does not see the change in port match as it is between the source transfer switch 105 and RF source 109. The port match difference term $\Gamma_1^0$ in Equations 7 can be used when applying the source signal to $a_2^0$ (physical port 2 of the measurement system 251), and can be used to calculate the $a_1^0$ reflected voltage wave. Similarly, the port match difference term $\Gamma_2^0$ term can be used when applying the source signal to $a_1^0$ (physical port 1 of the measurement system 251) and can be used to calculate the $a_2^0$ reflected voltage wave.

The forward reflection tracking term $e_1^{10}e_1^{01}$ of the 12-term error model (also referred to as $rt_{fwd}$) contains two combined error correction terms that can be isolated from each other in order to be used in the 8-term error model. This will require isolating and determining one of the error terms from Equations 5, Equations 6, and Equations 7. The isolated error term can then be used to derive the remaining combined error correction terms of Equations 4. Herewith, the $e_1^{01}$ error term is the selected isolated error term to determine absolute amplitude and cross-frequency phase.

To measure the absolute amplitude of the $e_1^{01}$ error term, the amplitude calibration device 257 is connected to the measurement system 251. The phase calibration device 259 is used to determine the cross-frequency phase of the isolated error term $e_1^{01}$.

Figure 7:
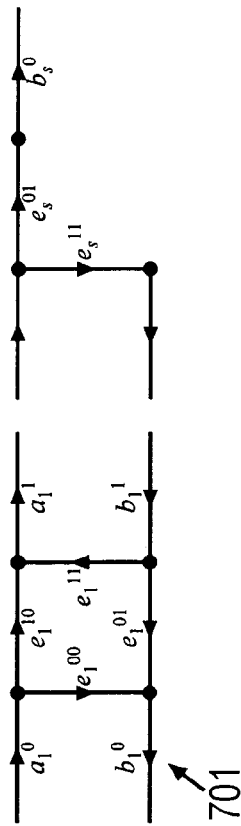
FIG. 7 illustrates an amplitude calibration device and error adapter model.

FIG. 7 illustrates an error adapter model 701 of the amplitude calibration device 257. To arrive at the absolute amplitude of the $e_1^{01}$ error term, the amplitude calibration device 257 of FIG. 2 is connected to port 1 of the measurement system 251 of FIG. 2. The incident power of the amplitude calibration device 257 is identified for the purposes of deriving the absolute amplitude of the $e_1^{01}$ error term.

The error adapter model 701 described FIG. 7 can be solved to determine the absolute amplitude of the selected error term $e_1^{01}$. All voltage waves ($a_1^0$, $b_1^0$) are measured when utilizing the 8-term error model. The amplitude calibration device 257 returns the power of $a_1^1$, and allows for the one port error term model to be solved with the identified value of $a_1^1$ from the amplitude calibration device 257. The match of the amplitude calibration device 257 is seen at $b_1^1$ and can be measured indirectly at port 1. The equations to derive the absolute amplitude of $e_1^{01}$ are described in Equations 8.

$$a_1^1 = a_1^0 e_1^{10} + b_1^1 e_1^{11}$$

$$b_1^0 = a_1^0 e_1^{00} + b_1^1 e_1^{01}$$

Equations 8

$$a_1^1 = \frac{1}{e_1^{01}}[b_1^0 e_1^{11} + a_1^0[e_1^{10}e_1^{01} - e_1^{00}e_1^{11}]]$$

$$|e_1^{01}|^2 = \frac{|b_1^0 e_1^{11} + a_1^0[e_1^{10}e_1^{01} - e_1^{00}e_1^{11}]|^2}{|a_1^1|^2}$$

Figure 8:
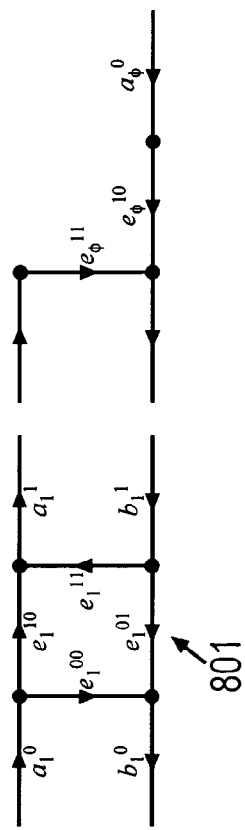
FIG. 8 illustrates a model of a phase calibration device and corresponding error adapter.

To arrive at the cross-frequency phase of the $e_1^{01}$ error term, the phase calibration device 259 and an error adapter model 801 of FIG. 8 are employed. The phase calibration device 259 is connected to port 1 of the measurement system 251 of FIG. 2. As phase is a relative term, it is described herewith as relative to a common time reference. To isolate the cross-frequency phase of the error term $e_1^{01}$, the $a_1^0$, $b_1^0$ voltage waves are measured against a static reference in one of two ways. First, by having a static phase for the local oscillator (LO) 107. Second, by using a static phase reference generator (an example of the phase calibration device 259) to normalize the measurements of the voltage waves. For example, if $x^\Phi$ represents the static phase reference generator, the normalization factor is $$(a_1^0/x^\phi, b_1^0/x^\phi).$$

The term 'static' phase refers to the phase remaining constant at each frequency during every sweep. The phase can differ for different frequencies during a frequency sweep. The phase must remain unchanged when the same frequency is measured when repeating the frequency sweep. This static reference can also be used when measuring the un-corrected voltage waves before applying error correction to get the corrected waves.

The value of the phase reference from the phase calibration device 259 can be accurately measured by an instrument common in the art. The values of $e_\phi^{10}$ and $a_\phi^0$ can subsequently be derived from the predetermined phase value. The error model 801 in FIG. 8 can be used to determine the cross-frequency phase of the error term $e_1^{01}$. Equations 9 can then be used to construct and solve for the cross-frequency phase of the error term $e_1^{01}$.

$$b_1^0 = \frac{a_\phi^0 e_\phi^{10} e_1^{01} + a_1^0 e_1^{00}[1 - e_1^{11} e_\phi^{11}] + a_1^0 e_1^{10} e_\phi^{01} e_1^{01}}{1 - e_1^{11} e_\phi^{11}}$$

Equations 9

$$e_1^{01} = \frac{b_1^0[1 - e_1^{11} e_\phi^{11}] - a_1^0 e_1^{00} + a_1^0 e_\phi^{11}[e_1^{00} e_1^{11} - e_1^{10} e_1^{01}]}{a_\phi^0 e_\phi^{10}}$$

$$\phi(e_1^{01}) = \phi\left(\frac{\begin{bmatrix} b_1^0[1 - e_1^{11} e_\phi^{11}] - \\ a_1^0[e_1^{00} - e_\phi^{11}[e_1^{00} e_1^{11} - e_1^{10} e_1^{01}]] \end{bmatrix}}{a_\phi^0 e_\phi^{10}}\right)$$

All voltage waves ($a_1^0$, $b_1^0$) are measured when utilizing the 8-term error model.

The error correction matrix in Equations 10 (below) illustrates the relationship of the measured voltage waves (uncorrected) to the DUT 261 voltage waves (corrected).

Using the 8-term error model of FIG. 4, the measured voltage waves ($a_1^0$, $a_2^0$, $b_1^0$, $b_2^0$) can then be related to the voltage waves ($a_1^1$, $b_1^1$, $a_2^1$, $b_2^1$) at the DUT 261 by solving for the remaining error correction terms and then computing corrected voltage waves of the DUT 261.

Equations 10 illustrates the error correction matrix and contains the error correction terms that relate the measured un-corrected to the corrected device voltage waves. It assumes that each measurement port is independent from each other (i.e. negligible crosstalk between the ports). These corrected voltage waves can then be converted into a number of meaningful measurement formats, such as S-parameters, current and power.

$$\begin{bmatrix} a_1^1 \\ b_1^1 \\ a_2^1 \\ b_2^1 \end{bmatrix} = \begin{bmatrix} R_1^{00} & R_1^{01} & 0 & 0 \\ R_1^{10} & R_1^{11} & 0 & 0 \\ 0 & 0 & R_2^{00} & R_2^{01} \\ 0 & 0 & R_2^{10} & R_2^{11} \end{bmatrix} \begin{bmatrix} a_1^0 \\ b_1^0 \\ a_2^0 \\ b_2^0 \end{bmatrix} \quad \text{Equations 10}$$

$R_x^y$ are elements of the error correction matrix generated from the 8-term error model of FIG. 4.

The $R_x^y$ error matrix elements are related to the 8-term error correction terms in Equations 11.

$$R_1^{00} = \frac{1}{e_1^{01}} [e_1^{10} e_1^{01} - e_1^{00} e_1^{11}] \quad \text{Equations 11}$$

$$R_1^{01} = \frac{1}{e_1^{01}} [e_1^{11}]$$

$$R_1^{10} = \frac{1}{e_1^{01}} [-e_1^{00}]$$

$$R_1^{11} = \frac{1}{e_1^{01}}$$

$$R_2^{00} = \frac{1}{e_2^{01}} [e_2^{10} e_2^{01} - e_2^{00} e_2^{11}]$$

$$R_2^{01} = \frac{1}{e_2^{01}} [e_2^{11}]$$

$$R_2^{10} = \frac{1}{e_2^{01}} [-e_2^{00}]$$

$$R_2^{11} = \frac{1}{e_2^{01}}$$

In the method described above, the $e_1^{01}$ error correction term is used to determine the absolute amplitude and cross-frequency phase at all frequencies of interest. To get the absolute amplitude and cross-frequency phase of port 2, the formulations in Equations 5, Equations 6, Equations 7, and the port 1 isolated error correction terms are employed again.

The error correction terms $e_1^{01}$ and $e_2^{01}$ are contained in each term of the error correction matrix show in Equations 11. Equations 11 provide the absolute nonlinear error correction since the absolute amplitude and cross-frequency phase of each error correction term are known. These error correction terms $e_1^{01}$ or $e_2^{01}$ (using Equations 10 and 11) relate the cross-frequency phase of the uncorrected to the corrected voltage waves in the matrix of Equations 10. The calibration method also requires that the measured un-corrected voltage waves be measured against $$(a_1^0/x^\phi, a_2^0/x^\phi, b_1^0/x^\phi, b_2^0/x^\phi).$$

the static phase of the LO 107 as used during the isolation of the cross-frequency phase of the $e_1^{01}$ error term.

The flow described in FIG. 3C, in conjunction with the details described in FIGS. 4, 5, 6, 7 and 8, illustrates adapting the measurement system 251 with an existing 12-term error model to characterize nonlinear behavior of the DUT 261 using an 8-term error model. The detailed flow can also describe adapting a measurement system with an existing 8-term error model to characterize nonlinear behavior of the DUT 261 using the same 8-term error model. The 8-term model can be used directly to derive the absolute amplitude and cross-frequency phase of the 8-term model error terms using the error adapter models 701 and 801. This was described in the flow of FIG. 3B.

While the embodiments described above constitute exemplary embodiments of the invention, it should be recognized that the invention can be varied in numerous ways without departing from the scope thereof. It should be understood that the invention is only defined by the following claims.

The invention claimed is:

1. A method of reducing systematic errors in a measurement system comprising:
   receiving calibration signals by the measurement system from calibration devices including a power sensor and a phase reference;
   determining absolute amplitude of isolated error terms based on calibration signals from the power sensor attached to a port of the measurement system and determining cross-frequency phase of isolated error terms based on calibration signals from the phase reference attached to the port of the measurement system, wherein the isolated error terms comprise error terms of a destination error model;
   applying the isolated error terms of the destination error model to characterize the measurement system;
   receiving measurement signals from a device under test; and
   displaying error corrected results of the device under test measurement signals using the characterized measurement system.

2. The method of claim 1 further comprising constructing an error correction matrix using the isolated error terms of the destination error correction model.

3. The method of claim 1 further comprising separating error terms of the destination error model to present the isolated error terms of the destination error model.

4. The method of claim 3 wherein the error terms are isolated using a lookup table.

5. The method of claim 1 wherein determining the absolute amplitude and the cross-frequency phase of the isolated error term comprises:
   determining the absolute amplitude of a selected error term from the isolated error terms;
   determining the cross-frequency phase of the selected error term; and
   solving for remaining error terms using the absolute amplitude and the cross-frequency phase of the selected error term.

6. The method of claim 1 further comprising applying hardware standards to quantify error terms of the destination error model.

7. The method of claim 1 further comprising performing relative error correction on the measurement system to quantify error terms of a first error model.

8. The method of claim 7 further comprising converting the first error model to the destination error model.

9. The method of claim 8 wherein converting the first error model to the destination error model is performed using a lookup table.

10. The method of claim 9 wherein the first error model is a 12-term error model, an 8-term error model, or a 16-term error model.

11. The method of claim 8 wherein the first error model is a 12-term error model and the destination error model is an 8-term error model and wherein convening from the 12-term error model to the 8-term error model comprises using a port match difference term to facilitate the converting.

12. The method of claim 8 wherein the first error model is a 12-term error model and the destination error model is an 8-term error model and wherein convening from the 12 term error model to the 8 term error model comprises:
  using tracking conversions for $e_1^{10}e_2^{01}$; and
  using tracking conversions for $e_2^{10}e_1^{01}$.

13. The method of claim 2, further comprising:
  measuring raw incident and reflected voltage waves of a device under test, the device under test connected to the measurement system; and
  applying the error correction matrix to the raw incident and reflected voltage waves of the device under test to get corrected data.

14. The method of claim 1 wherein, the measurement system is a vector network analyzer, a real-time or equivalent-time oscilloscope, or a vector signal analyzer.

15. A computer readable media containing code thereon, the code providing instructions to a measurement system for executing the steps of:
  determining absolute amplitude of isolated error terms based on calibration signals from a power sensor attached to a port of the measurement system and determining cross-frequency phase of isolated error terms based on calibration signals from a phase reference attached to the port of the measurement system, wherein the isolated error terms comprise error terms of a destination error model; and
  applying the isolated error terms of the destination error model to characterize the measurement system.

16. The computer readable media containing code thereon as recited in claim 15, the code providing instructions to the measurement system for executing the additional steps of:
  measuring raw incident and reflected voltage waves of a device under test, the device under test connected to the measurement system; and
  applying the error correction matrix to the raw incident and reflected voltage waves of the device under test to get corrected data.

17. The computer readable media containing code thereon as recited in claim 15, the code providing instructions to the measurement system for executing the additional step of quantifying error correction terms of the measurement system by performing relative error correction.

18. The computer readable media containing code thereon as recited in claim 15, wherein:
  the absolute amplitude is measured by an amplitude calibration device, the amplitude calibration device connected to the measurement system; and
  the cross-frequency phase is measured by a phase calibration device, the phase calibration device connected to the measurement system.

19. The computer readable media containing code thereon as recited in claim 15, the code providing instructions to the measurement system for executing the additional step of applying hardware standards to quantify error terms of the destination error model.

20. The computer readable media containing code thereon as recited in claim 15, wherein the measurement system is a vector network analyzer, a real-time or equivalent-time oscilloscope, or a vector signal analyzer.

21. The computer readable media containing code thereon as recited in claim 15, the code providing instructions to the measurement system for executing the additional step of modifying a first error model to include a port match difference term to facilitate creating the destination error model.

22. The computer readable media containing code thereon as recited in claim 21, the code providing instructions to the measurement system wherein the first error model of the measurement system is a 12-term, 8-term or 16-term error model; and
  the destination error model of the measurement system is an 8-term or 16-term error model.

23. The computer readable media containing code thereon as recited in claim 22, the code providing instructions to the measurement system wherein convening from the 12 term error model to the 8 term error model comprises:
  using tracking conversions for $e_1^{10}e_2^{01}$ and
  using tracking conversions for $e_2^{10}e_1^{01}$.

* * * * *